(12) United States Patent
Simmons et al.

(10) Patent No.: US 10,867,829 B2
(45) Date of Patent: Dec. 15, 2020

(54) CERAMIC HYBRID INSULATOR PLATE

(71) Applicant: Applied Materials, Inc., Santa Clara, CA (US)

(72) Inventors: Jonathan Simmons, San Jose, CA (US); Dana Lovell, San Mateo, CA (US)

(73) Assignee: Applied Materials, Inc., Santa Clara, CA (US)

( * ) Notice: Subject to any disclaimer, the term of this patent is extended or adjusted under 35 U.S.C. 154(b) by 400 days.

(21) Appl. No.: 16/037,975

(22) Filed: Jul. 17, 2018

(65) Prior Publication Data
US 2020/0027769 A1 Jan. 23, 2020

(51) Int. Cl.
*H01L 21/683* (2006.01)
*H01L 21/67* (2006.01)

(52) U.S. Cl.
CPC .... *H01L 21/6833* (2013.01); *H01L 21/67103* (2013.01)

(58) Field of Classification Search
CPC .............. H01L 21/6833; H01L 21/6831; H01L 21/68757; H01L 21/67109; H01L 21/67103
USPC ........................................................ 361/234
See application file for complete search history.

(56) References Cited

U.S. PATENT DOCUMENTS

| 2004/0027781 | A1* | 2/2004 | Hanawa ............ H01L 21/67109 361/234 |
| 2005/0083634 | A1* | 4/2005 | Breitschwerdt ..... H01L 21/6833 361/234 |
| 2014/0265089 | A1* | 9/2014 | Tantiwong ........ H01L 21/68735 269/14 |
| 2019/0198297 | A1* | 6/2019 | Aramaki ............. H01L 21/3065 |

OTHER PUBLICATIONS

Chinese Office Action for Application No. 201921109915.0 dated Nov. 13, 2019.
Taiwan Office Action for Application No. TW108209192 dated Dec. 2, 2019.

* cited by examiner

*Primary Examiner* — Kevin J Comber
(74) *Attorney, Agent, or Firm* — Patterson + Sheridan, LLP

(57) ABSTRACT

The present disclosure generally relates to an electrostatic chuck for processing substrates. The electrostatic chuck includes a facilities plate and an insulator disposed between a cooling base and a ground plate. A support body is coupled to the cooling base for supporting a substrate thereon. A ring is configured to surround the insulator. The ring is formed from a material that is resistant to degradation from exposure to a manufacturing process. The ring optionally includes an extension configured to surround the facilities plate.

20 Claims, 3 Drawing Sheets

CERAMIC HYBRID INSULATOR PLATE

BACKGROUND

Field

Embodiments of the present disclosure generally relate to an electrostatic chuck for processing substrates.

Description of the Related Art

In the fabrication of integrated circuits, deposition processes such as chemical vapor deposition (CVD) or atomic layer deposition (ALD) are used to deposit films of various materials upon semiconductor substrates. In other operations, a layer altering process, such as etching, is used to expose a portion of a deposited layer for further depositions. Often, these deposition or etching processes are used in a repetitive fashion to fabricate various layers of an electronic device, such as a semiconductor device.

As technology advances, new chemistry and processes are being utilized to fabricate ever increasingly complex circuits and semiconductor devices. Such chemistries and processes can damage conventional components used in processing chambers.

Therefore, there is a need for chamber processing components for device fabrication, which can be used with new manufacturing processes.

SUMMARY

The present disclosure generally relates to an electrostatic chuck for processing substrates.

In one embodiment, a process chamber has a body with a sidewall and a bottom. A lid is coupled to the body defining a process volume therein. An electrostatic chuck is disposed in the process volume. The electrostatic chuck has a ground plate, an insulator, a facilities plate, a cooling base, and a support body. The support body has an electrode disposed therein. A ceramic ring is disposed surrounding the insulator.

In another embodiment, an electrostatic chuck has a ground plate, an insulator, a facilities plate, a cooling base, and a support body. An electrode is disposed within the support body. The electrostatic chuck also has a ring disposed surrounding the insulator. The ring is formed from a ceramic material.

In yet another embodiment, an electrostatic chuck has a ground plate, an insulator, a facilities plate, a cooling base, and a support body. An electrode is disposed within the support body. The electrostatic chuck also includes a ring having an annular portion and an extension extending therefrom. The annular portion surrounds the insulator and the extension surrounds the facilities plate.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to an electrostatic chuck for processing substrates. The electrostatic chuck includes a facilities plate and an insulator disposed between a cooling base and a ground plate. A support body is coupled to the cooling base for supporting a substrate thereon. A ring is configured to surround the insulator. The ring is formed from a material that is resistant to degradation from exposure to a manufacturing process. The ring optionally includes an extension configured to surround the facilities plate.

Figure 1:
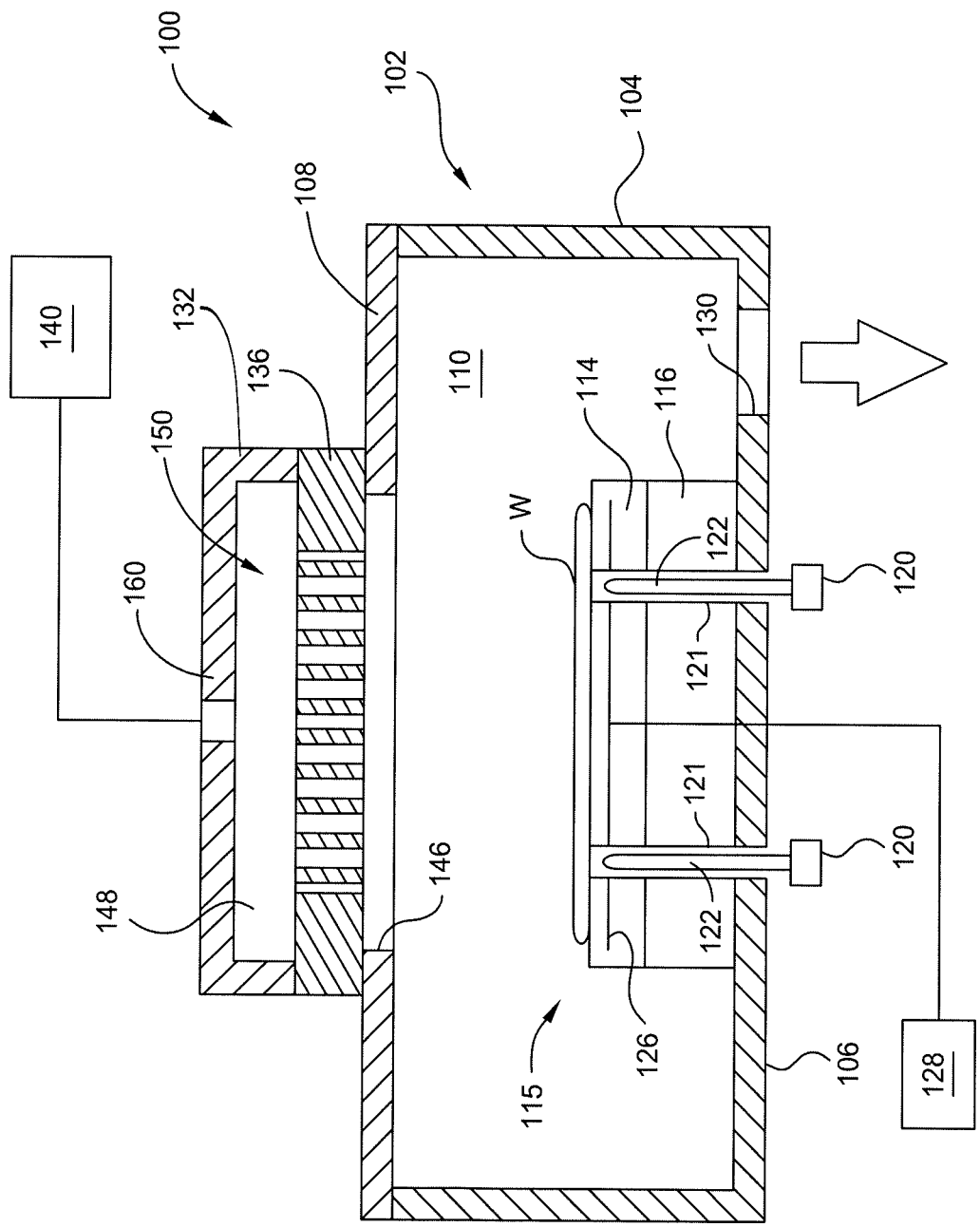
FIG. 1 is schematic arrangement in cross-section of an exemplary processing chamber.

FIG. 1 is a schematic arrangement, in partial cross-section, of an exemplary processing chamber 100 according to one embodiment. The processing chamber 100 includes a body 102 having a sidewall 104 and bottom 106. A lid 108 couples to the body 102 to define a process volume 110 therein. The body 102 is generally formed from a metal, such as aluminum or stainless steel, but any material suitable for use with processes performed in the processing chamber 100 may be utilized.

A faceplate 136 is coupled to the lid 108. A plurality of apertures 150 are formed through the faceplate 136 and in fluid communication with the process volume 110 though an opening 146 formed in the lid 108. A cover plate 132 is coupled to the faceplate 136 defining a plenum 148 therebetween. A gas is flowed into the plenum 148 from a gas panel 140 through an inlet port 160 formed in the cover plate 132. The gas flows from the plenum 148, through the apertures 150 in the faceplate 136, and into the process volume 110.

An electrostatic chuck 115 supported by the bottom 106 is disposed within the process volume 110 for supporting a substrate W thereon. The electrostatic chuck 115 includes a support body 114 coupled to a base 116. A plurality of lift pins 122 are optionally disposed through openings 121 formed in the electrostatic chuck 115. The lift pins 122 are coupled to actuators 120 for raising and lowering the lift pins 122 for positioning the substrate "W" on the support body 114. A vacuum system (not shown) is fluidly coupled to the process volume 110 through an opening 130 in order to evacuate effluent from the process volume 110.

To facilitate processing of a substrate W in the processing chamber 100, the substrate W is disposed on the support body 114. An electrode 126 is disposed within the support body 114 and electrically coupled to a power source 128 through the base 116. The electrode 126 is selectively biased by the power source 128 to create an electromagnetic field to electrostatically chuck the substrate W to the support body 114. In certain embodiments, the electrode 126 is a heating electrode capable of increasing a temperature of the support body 114 and the substrate W when supported thereon.

Figure 2:
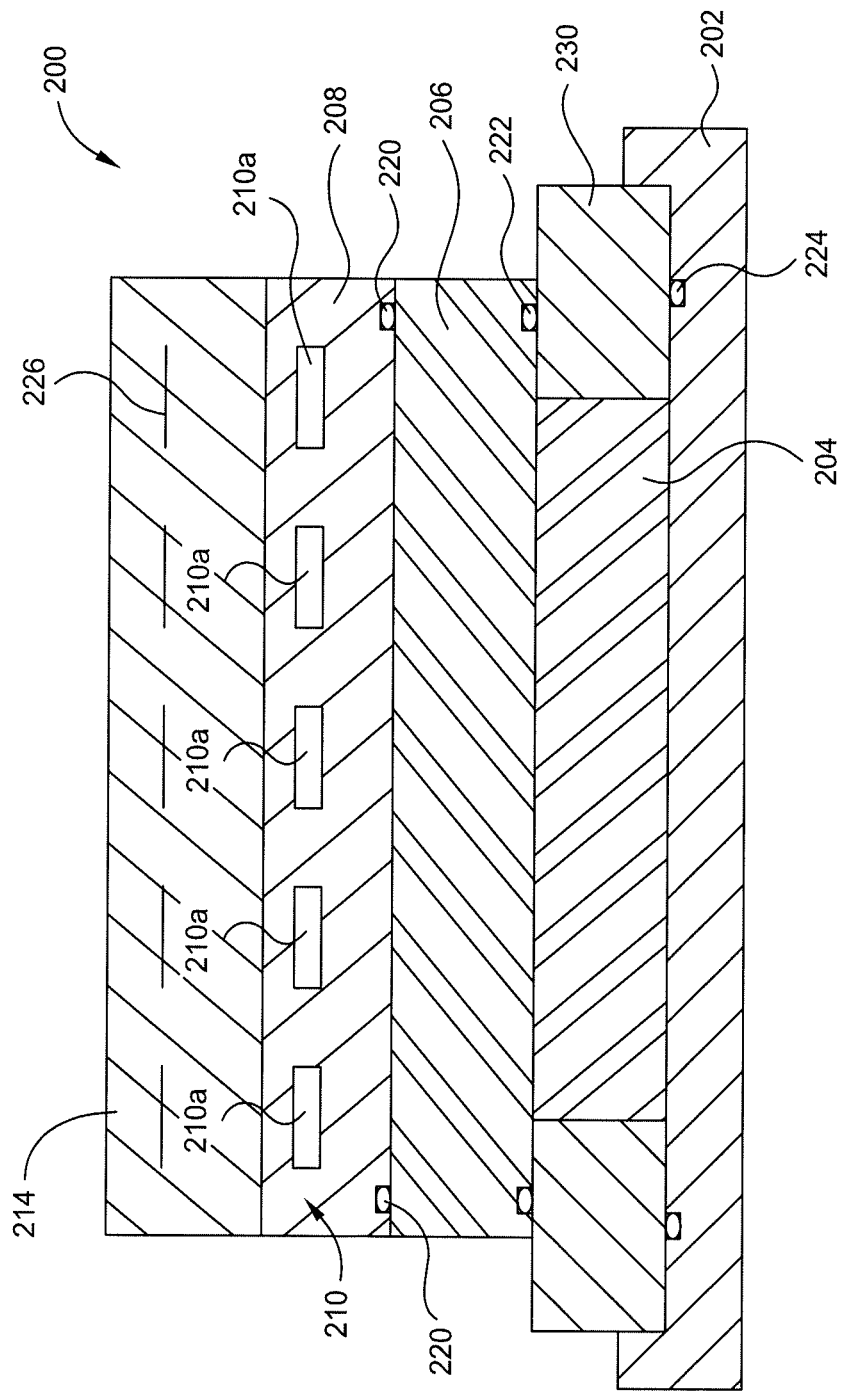
FIG. 2 is a schematic arrangement in cross-section of an electrostatic chuck according to one embodiment.

FIG. 2 is a cross-section of an exemplary electrostatic chuck 200. The electrostatic chuck 200 can be used as the electrostatic chuck 115 of FIG. 1. In FIG. 2, the openings 121 and the lift pins 122 are not shown for clarity. The electrostatic chuck 200 has a ground plate 202, an insulator 204, a facilities plate 206, and a cooling base 208, which supports a support body 214. The ground plate 202 is generally formed from a metal, such as aluminum, and is configured to be coupled to a bottom of a chamber. The ground plate 202 includes holes (not shown) for coupling mechanisms, for example screws or bolts, for securing the other portions of the electrostatic chuck 200, such as the insulator 204, the facilities plate 206, and the cooling base 208, thereto.

The insulator 204 is formed from a polymeric material, such as REXOLITE® polymer (cross-linked polystyrene), polytetrafluoroethylene (PTFE), polyamide-imide (PAI), polyetheretherketone (PEEK), and polyetherimide, among others. The insulator 204 functions to reduce the thermal and electrical interaction between the support body 214, having the electrode 226 therein, and the ground plate 202. A facilities plate 206 is coupled to the insulator 204 and provides a pathway for connections (i.e., electrical and/or fluid conduits) to cooling base 208 and the support body 214. The facilities plate 206 is also formed from a metal, such as aluminum or stainless steel.

The cooling base 208 is coupled to the facilities plate 206. The cooling base 208 includes a temperature control device 210 disposed therein for controlling a temperature of the support body 214 coupled thereto. Here, the temperature control device 210 is a series of channels 210a for flowing a fluid, such as water, air, nitrogen, ethylene glycol, among others, therethrough. The channels 210a are coupled to a heat exchange device (not shown) for controlling the temperature of the fluid. A seal 220 is disposed around the periphery of cooling base 208. Here, the seal 220 is an O-ring disposed in a groove formed in the cooling base 208. However, other types of devices may be used for the seal 220. The seal 220 functions to prevent passage of a fluid between the cooling base 208 and the facilities plate 206.

A ring 230 is disposed between the facilities plate 206 and the ground plate 202 surrounding the insulator 204. The ring 230 is formed from a material resistant to degradation from exposure to manufacturing processes such as a ceramic, for example aluminum oxide or yttrium oxide, among others. In another example, the ring 230 is formed from quartz. The ring 230 has a radially outward face 230b which is sized to fit within a recess 202a formed in the ground plate 202. The ring 230 also has a radially inward surface 230a, which has a diameter slightly larger than an outer diameter of the insulator 204. Therefore, an opening is formed through the ring 230 wherein the insulator 204 is disposed. In one embodiment, the ring 230 has a thickness substantially equal to a thickness of the insulator 204.

A seal 222 is disposed between the ring 230 and the facilities plate 206 to prevent passage of the fluid therebetween. Similarly, a seal 224 is disposed between the ring 230 and the ground plate 202. Here, the seals 222, 224 are O-rings disposed in grooves. However, other types of devices may be used for the seals 222, 224. The ring 230 and the seals 222, 224 isolate the insulator 204 from the manufacturing processes, which can damage the insulator 204 thereby extending the maintenance life thereof and increasing throughput of the chamber.

Figure 3:
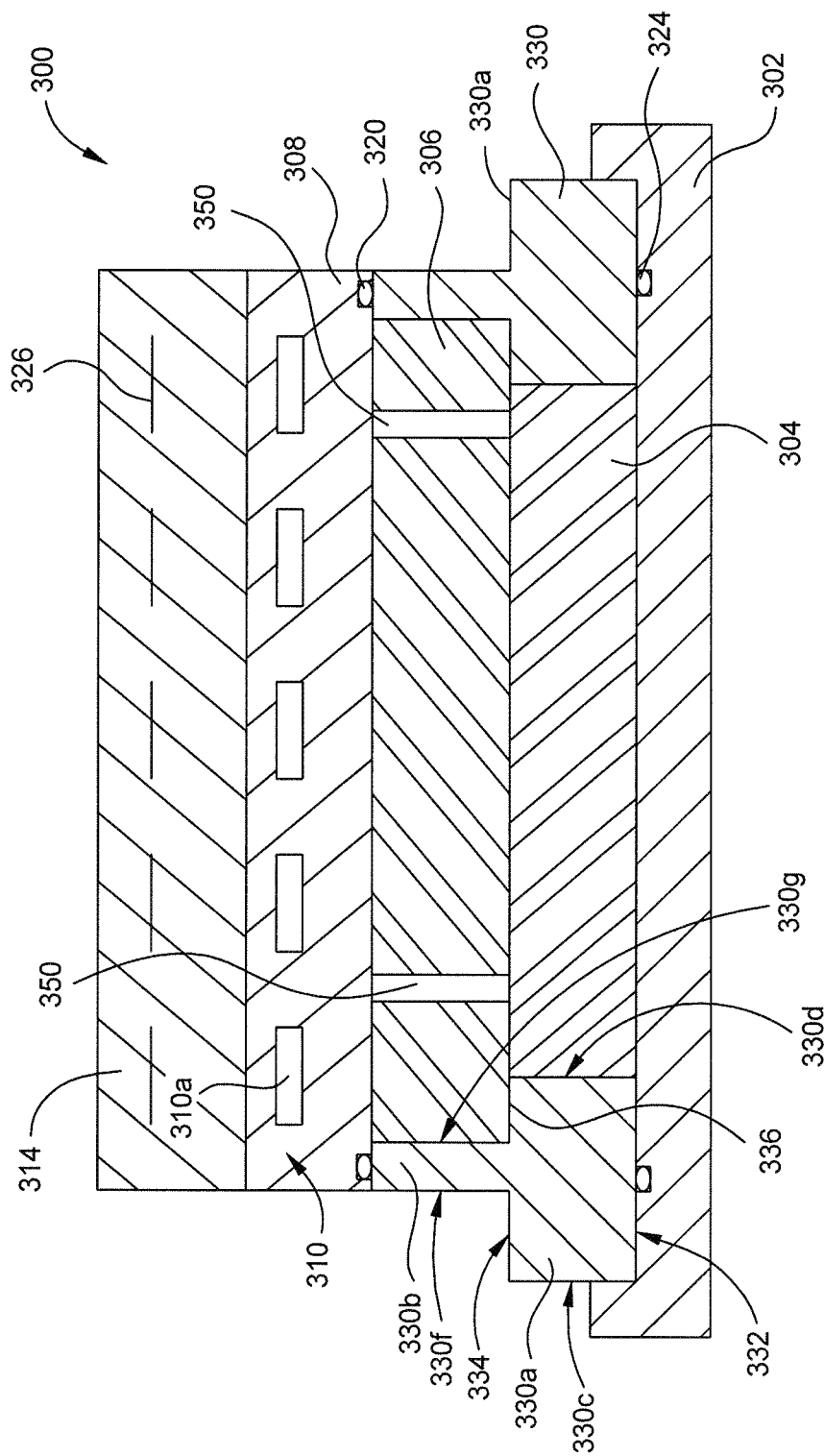
FIG. 3 is a schematic arrangement in cross-section of an electrostatic chuck according to another embodiment.

FIG. 3 is a cross-section of an exemplary electrostatic chuck 300. The electrostatic chuck 300 is like the electrostatic chuck 200 but uses a different ring 330 and facilities plate 306. The electrostatic chuck 300 again has a cooling base 308, a facilities plate 306, and an insulator 304 disposed on the ground plate 302. A support body 314 is coupled to the cooling base 308. The cooling base 308 includes channels 310a for flowing a fluid therein as part of a temperature control device 310 for controlling the temperature of the support body 314.

The ring 330 is disposed between the cooling base 308 and the ground plate 302. The ring 330 is formed from a material, which is resistant to degradation from exposure to the manufacturing processes. Exemplary materials include a ceramic, such as aluminum oxide, yttrium oxide, among others, or quartz. In this embodiment, the ring 330 has an annular portion 330a and an extension 330b. The annular portion 330a couples to the ground plate 302 at a lower surface 332. The annular portion 330a has a radially outward surface 330c which is sized to be disposed within a recess 302a formed in the ground plate 302. The annular portion 330a also has a radially inward surface 330d, which defines an opening through the annular portion 330a. The radially inward surface 330d has a diameter slightly larger than an outer diameter of the insulator 304 so the insulator 304 can be disposed within the opening. In one embodiment, the insulator 304 has a thickness substantially equal to a thickness of the annular portion 330a.

The extension 330b extends from an upper surface 334 of the annular portion 330a. Extension 330b has a radially outward surface 330f which has a diameter that is less than a diameter of the radially outward surface 330c of the annular portion 330a. The extension 330b also has a radially inner surface 330g, which has a diameter that is greater than the diameter of the radially inward surface 330d of the annular portion 330a. Therefore, a shoulder 336 is formed between the annular portion 330a and the extension 330b. A portion of the facilities plate 306 is disposed on the shoulder 336 where the extension 330b surrounds the facilities plate 306. In one example, the extension 330b has a thickness substantially equal to the thickness of the facilities plate 306. The cooling base 308 couples to the extension 330b at an end thereof opposite of the annular portion 330a.

A seal 320 is disposed between extension 330b and the cooling base 308 to prevent passage of a fluid therebetween. Similarly, a seal 324 is disposed between the annular portion 330a and the ground plate 302. Here, the seals 320, 324 are O-rings disposed in grooves, though other devices may be used. The ring 330 and the seals 320, 324 isolate the insulator 304 and the facilities plate 306 from the manufacturing processes. The materials used to form the insulator 304 and the facilities plate 306 are susceptible to degradation from exposure to the manufacturing processes. However, the ring 330 and the seals 320, 324 protect the insulator 304 and the facilities plate 306 from degradation thus extending the manufacturing life. Additionally, the use of the extension 330b eliminates the need for a seal between facilities plate 306 and the ring 330. By eliminating a seal, the potential exposure of the facilities plate 306 and the insulator 304 to the manufacturing processes is further reduced thus increasing the protection of the facilities plate 306 and the insulator 304.

During operation, the electrode 326 applies a chucking force to the substrate W (FIG. 1). In conventional designs, the insulator 304 and the facilities plate 306 absorb the reaction to the chucking force as well as a vacuum force present within the chamber. Over time, the repetitive absorption fatigues the insulator 304 and the facilities plate 306 which cause damage, such as cracking, to these components. However, by utilizing the embodiments described herein, the ring 330 absorbs forces applied to the electrostatic chuck 300 by the chucking electrode 326 rather than the insulator 304 and the facilities plate 306. Therefore, the ring 330 prevents damage to the insulator 304 and the facilities plate 306 due to the chucking and vacuum forces and extends the life of the insulator 304 and the facilities plate 306.

In one example, the dielectric properties of the electrostatic chuck 200, 300 are configured to provide an adequate chucking force to the substrate W (FIG. 1). For example, the amount of ceramic material (i.e., rings 230, 330) and the polymeric material (i.e., facilities plate 206, 306 and insulator 204, 304) change the capacitance of the electrostatic chucks 200, 300. The sizing of the rings 230, 330, the facilities plates 206, 306, and the insulators 204, 304 are selected to provide a desired capacitance of the electrostatic chuck 200, 300. In one example illustrated in FIG. 3, the facilities plate 306 has cutouts 350, which are sized to increase or decrease the capacitance of the electrostatic chuck 300 as desired. The size and arrangement of the cutouts 350 are selected to achieve the desired capacitance.

While the foregoing is directed to embodiments of the present disclosure, other and further embodiments of the disclosure may be devised without departing from the basic scope thereof, and the scope thereof is determined by the claims that follow.

What is claimed is:

1. A process chamber comprising:
    a body having a sidewall and a bottom;
    a lid coupled to the body defining a process volume therein; and
    an electrostatic chuck disposed in the process volume, the electrostatic chuck comprising:
        a ground plate;
        an insulator disposed on the ground plate;
        a facilities plate disposed on the insulator;
        a cooling base disposed on the facilities plate;
        a support body disposed on the cooling base, the support body having an electrode therein; and
        a ring disposed surrounding the entire insulator, wherein the ring is formed from a ceramic material, wherein the ring or an annular portion of the ring has a thickness that is substantially equal to a thickness of the insulator.

2. The process chamber of claim 1, wherein the ring has an internal surface defining an opening through the ring, wherein the insulator is disposed in the opening.

3. The process chamber of claim 1, wherein the ring comprises the annular portion and an extension.

4. The process chamber of claim 3, wherein the insulator is surrounded by the annular portion and the facilities plate is surrounded by the extension.

5. The process chamber of claim 1, wherein the insulator is formed from a polymeric material.

6. The process chamber of claim 1, wherein the ring is formed from aluminum oxide or yttrium oxide.

7. An electrostatic chuck comprising:
    a ground plate;
    an insulator disposed on the ground plate;
    a facilities plate disposed on the insulator;
    a cooling base disposed on the facilities plate;
    a support body disposed on the cooling base, the support body having an electrode therein; and
    a ring disposed surrounding the entire insulator, wherein the ring is formed from a ceramic material and wherein a thickness of the ring or an annular portion of the ring is substantially equal to a thickness of the insulator.

8. The electrostatic chuck of claim 7, further comprising:
    a first seal disposed between the ring the facilities plate; and
    a second seal disposed between the ring and the ground plate.

9. The electrostatic chuck of claim 8, wherein the first seal, the second seal, and the ring isolate the insulator disposed within the ring.

10. The electrostatic chuck of claim 7, wherein the ring has a radially inward surface defining an opening therethrough, and wherein the insulator is disposed within the opening.

11. The electrostatic chuck of claim 7, wherein the insulator is formed from a polymeric material.

12. The electrostatic chuck of claim 7, wherein the ring is formed from aluminum oxide or yttrium oxide.

13. An electrostatic chuck comprising:
    a ground plate;
    an insulator disposed on the ground plate;
    a facilities plate disposed on the insulator;
    a cooling base disposed on the facilities plate;
    a support body disposed on the cooling base, the support body having an electrode therein; and
    a ring comprising:
        an annular portion surrounding the entire insulator; and
        an extension extending from the annular portion, wherein the extension surrounds the facilities plate and a thickness of the annular portion is substantially equal to the thickness of the insulator.

14. The electrostatic chuck of claim 13, further comprising:
    a first seal disposed between the ring and the cooling base; and
    a second seal disposed between the ring and the ground plate.

15. The electrostatic chuck of claim 14, wherein the first seal, the second seal, and the ring isolate the insulator and the facilities plate disposed within the ring.

16. The electrostatic chuck of claim 13, wherein the annular portion has a radially inward surface defining an opening therethrough, and wherein the insulator is disposed within the opening.

17. The electrostatic chuck of claim 13, wherein the extension has a radially inward surface configured to surround the facilities plate.

18. The electrostatic chuck of claim 17, wherein a shoulder is formed between the annular portion and the extension, wherein a portion of the facilities plate is disposed on the shoulder.

19. The electrostatic chuck of claim 13, wherein the insulator is formed from a polymeric material.

20. The electrostatic chuck of claim 13, wherein the ring is formed from aluminum oxide or yttrium oxide.

* * * * *